(12) United States Patent
Lee et al.

(10) Patent No.: US 7,825,581 B2
(45) Date of Patent: Nov. 2, 2010

(54) ORGANIC LIGHT EMITTING DIODE DISPLAY AND METHOD FOR MANUFACTURING THE SAME

(75) Inventors: Sung-Soo Lee, Suwon-si (KR); Jun-Ho Choi, Yongin-si (KR); Chang-Woong Chu, Suwon-si (KR); Seong-Min Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 12/121,188

(22) Filed: May 15, 2008

(65) Prior Publication Data

US 2009/0200922 A1    Aug. 13, 2009

Related U.S. Application Data

(63) Continuation-in-part of application No. 12/112,561, filed on Apr. 30, 2008.

(30) Foreign Application Priority Data

Feb. 12, 2008    (KR) ...................... 10-2008-0012622

(51) Int. Cl.
*H01J 1/62*    (2006.01)
*H01J 63/04*   (2006.01)
(52) U.S. Cl. .................. 313/503; 313/498; 313/504; 313/506; 313/512
(58) Field of Classification Search .......... 313/498–512
See application file for complete search history.

(56) References Cited

U.S. PATENT DOCUMENTS

| | | | |
|---|---|---|---|
| 5,554,911 A | 9/1996 | Nakayama et al. | |
| 7,271,537 B2 | 9/2007 | Matsuda et al. | |
| 2005/0225237 A1 | 10/2005 | Winters | |
| 2007/0015429 A1* | 1/2007 | Maeda et al. | ................. 445/24 |
| 2007/0024186 A1 | 2/2007 | Chen et al. | |
| 2007/0200123 A1* | 8/2007 | Yamamichi et al. | ........... 257/89 |
| 2008/0048560 A1* | 2/2008 | Sung et al. | ................... 313/504 |
| 2008/0122347 A1* | 5/2008 | Lee | ............................. 313/504 |
| 2009/0091238 A1* | 4/2009 | Cok et al. | ................... 313/498 |

FOREIGN PATENT DOCUMENTS

JP    2006-261094    9/2006

(Continued)

*Primary Examiner*—Karabi Guharay
*Assistant Examiner*—Kevin Quarterman
(74) *Attorney, Agent, or Firm*—Cantor Colburn LLP

(57) ABSTRACT

A method for manufacturing an organic light emitting diode ("OLED") display which includes first and second pixels each displaying a different color, the method includes: sequentially depositing a first transparent conductive layer and a translucent conductive layer; forming an intermediate first electrode on the second pixel by photolithography and etching of the translucent conductive layer; depositing a second transparent conductive layer on the intermediate first electrode and the first transparent conductive layer; forming a first electrode of the first pixel which includes upper and lower layers on the first pixel and a first electrode of the second pixel which includes a lower first electrode, an intermediate first electrode, and an upper first electrode by photolithography and etching of the second transparent conductive layer and the first transparent conductive layer; forming an emission layer on the first electrodes of the first and second pixels; and forming a second electrode on the emission layer.

15 Claims, 24 Drawing Sheets

FOREIGN PATENT DOCUMENTS

| | | |
|---|---|---|
| JP | 2006-269327 | 10/2006 |
| JP | 2006-269329 | 10/2006 |
| JP | 2007-115626 | 5/2007 |
| JP | 2007-134153 | 5/2007 |
| KR | 1020050031955 A | 4/2005 |
| KR | 1020060043262 A | 5/2006 |
| KR | 1020060046476 A | 5/2006 |
| KR | 1020070017360 A | 2/2007 |

\* cited by examiner

ORGANIC LIGHT EMITTING DIODE DISPLAY AND METHOD FOR MANUFACTURING THE SAME

CROSS-REFERENCE TO RELATED APPLICATION

This application is a continuation-in-part of U.S. patent application Ser. No. 12/112,561, filed on Apr. 30, 2008, which claims priority to Korean Patent Application No. 10-2008-0012622, filed on Feb. 12, 2008, the contents of which in their entirety are herein incorporated by reference.

BACKGROUND OF THE INVENTION (a) Field of the Invention

The present invention relates to an organic light emitting diode ("OLED") display and a manufacturing method thereof.

(b) Description of the Related Art

Recently, as demands for lighter or thinner monitors or TVs have been increasing, cathode ray tubes ("CRTs") are being replaced by liquid crystal displays ("LCDs").

However, as light-receiving devices, the LCDs are disadvantageous in that they require a light source such as a backlight and have many limitations in terms of response speed and viewing angle.

Recently, OLED displays have received much attention as display devices that can overcome such limitations of the LCDs.

The OLED display includes two electrodes and an emission layer sandwiched therebetween, in which electrons injected from one electrode and holes injected from the other electrode are recombined in the emission layer to form excitons, and as the excitons release energy, the OLED display is illuminated.

The OLED display is a self-emission type of display that does not require a light source such as a backlight, so it is advantageous in terms of power consumption. Furthermore, the OLED display has good response speed, viewing angle and contrast ratio.

The OLED display includes a plurality of pixels such as red pixels, blue pixels and green pixels. A full color spectrum can be expressed by combining the various red pixels, blue pixels and green pixels.

In this case, the red pixel, the blue pixel and the green pixel include a red emission layer, a blue emission layer and a green emission layer, respectively, to express color. The emission layers may be deposited pixel-by-pixel using a fine shadow mask. However, as the size of the display device is increased, there is a limitation in depositing such emission layers at each pixel when using the fine shadow mask.

Therefore, a technique has been proposed in which the red emission layer, the blue emission layer and the green emission layer are sequentially stacked on the entire display device using an open mask to emit white light. Color filters are disposed at positions where the emitted light passes through to thus express red, green and blue colors by pixel.

However, due to the limitation in color reproducibility of the color filters themselves, light that passes through the color filters is bound to have color reproducibility which at best may be the same as, or more likely lower than the color reproducibility of the color filters. As a result of the limitation in color reproducibility of the color filters, such high color reproducibility as required by the National Television Systems Committee ("NTSC") is difficult to achieve from the light that passes through the color filters.

BRIEF SUMMARY OF THE INVENTION

The present invention has been made in an effort to provide an organic light emitting diode ("OLED") display having aspects, features and advantages of achieving high color reproducibility with white emission.

An exemplary embodiment of the present invention provides an organic light emitting diode ("OLED") display including: first to third pixels each displaying a different color, wherein each pixel includes a first electrode, a second electrode facing the first electrode, and an emission layer sandwiched between the first and second electrodes, wherein first electrodes of the first and second pixels include a transparent conductive oxide. The first electrode of the third pixel includes a lower first electrode, an intermediate first electrode, a transparent conductive oxide, and an upper first electrode. The lower first electrode includes a transparent conductive oxide, and the intermediate first electrode is formed on the lower first electrode and includes a translucent conductor which forms microcavities with the second electrode. The upper first electrode is formed on the intermediate first electrode, includes a transparent conductive oxide, and covers upper and lateral surfaces of the intermediate first electrode.

Another exemplary embodiment of the present invention provides a method for manufacturing an organic light emitting diode ("OLED") display which includes first and second pixels each displaying a different color, the method including: sequentially depositing a first transparent conductive layer and a translucent conductive layer; forming an intermediate first electrode on the second pixel by photolithography and etching the translucent conductive layer; depositing a second transparent conductive layer on the intermediate first electrode and the first transparent conductive layer; forming a first electrode of the first pixel which includes upper and lower layers on the first pixel and a first electrode of the second pixel which includes a lower first electrode, an intermediate first electrode, and an upper first electrode by photolithography and etching of the second transparent conductive layer and the first transparent conductive layer; forming an emission layer on the first electrodes of the first and second pixels; and forming a second electrode on the emission layer.

The color purity and color reproducibility can be improved by strengthening light of a narrow wavelength region and suppressing light of wavelength regions other than the narrow wavelength region at the green pixel. In addition, by adjusting the thickness of a transparent conductive layer and a transparent conductive layer at the green pixel, a spectrum having a peak of a desired wavelength range can be formed and color purity can be enhanced.

DETAILED DESCRIPTION OF THE INVENTION

Figure 1:
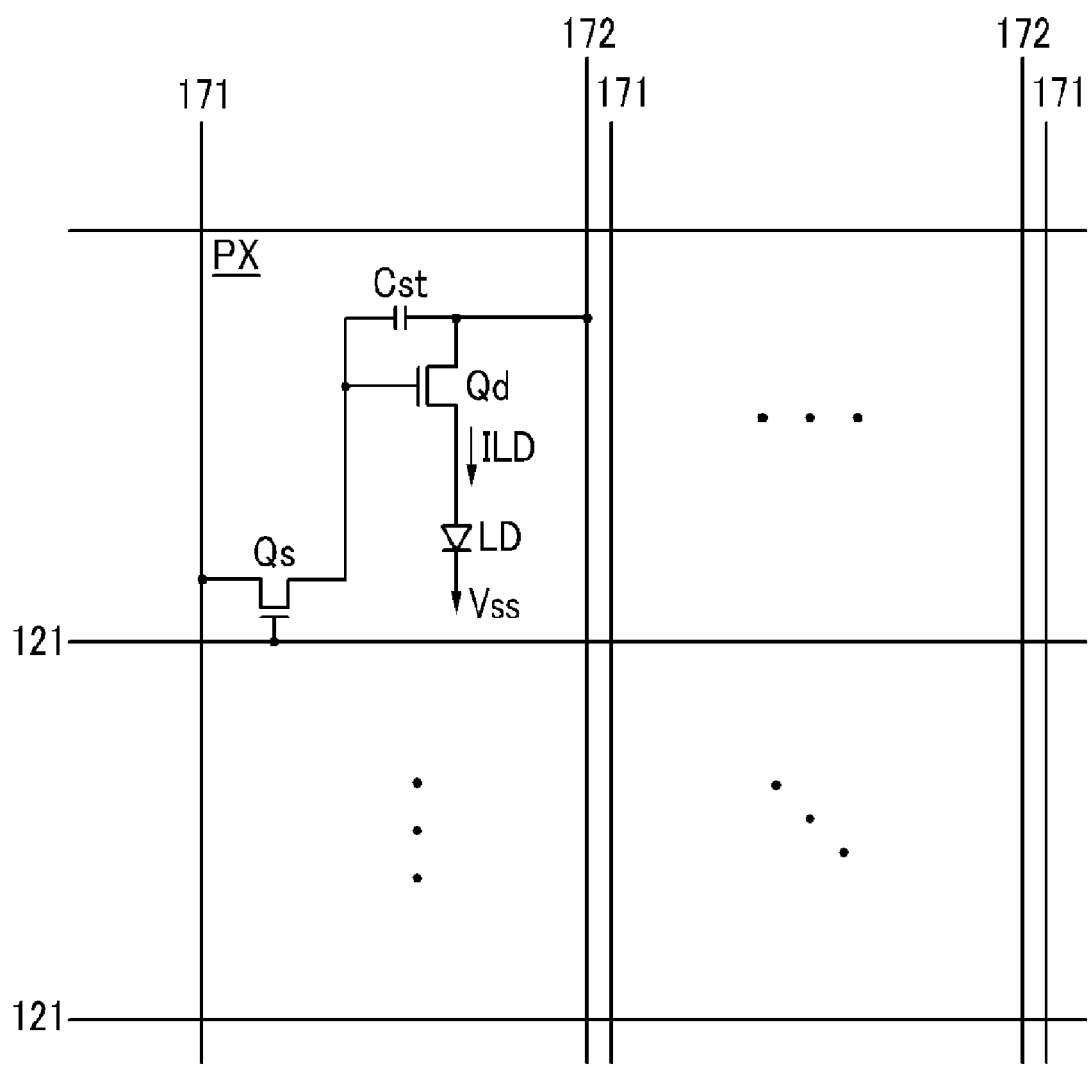
FIG. 1 is an equivalent circuit schematic diagram of an OLED display according to an exemplary embodiment of the present invention.

The present invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in further detail with reference to the accompanying drawings. An organic light emitting diode ("OLED") display according to an exemplary embodiment of the present invention will now be described with reference to FIG. 1.

FIG. 1 is an equivalent circuit schematic diagram of the OLED display according to an exemplary embodiment of the present invention.

The OLED display includes a plurality of signal lines 121, 171 and 172 and a plurality of pixels (PX) connected with the signal lines 121, 171 and 172, and the plurality of pixels (PX) are arranged substantially in a matrix.

The signal lines include a plurality of gate lines 121 which transmit gate signals (or scan signals), a plurality of data lines 171 which transmit data signals and a plurality of driving voltage lines 172 which transmit driving voltages. The gate lines 121 extend substantially in a row direction and are substantially parallel to each other, and the data lines 171 and the driving voltage lines 172 extend substantially in a column direction and are substantially parallel to each other, as illustrated in FIG. 1.

Each pixel (PX) includes a switching thin film transistor ("TFT") Qs, a driving TFT Qd, a storage capacitor Cst and an organic light emitting diode ("OLED") LD.

The switching TFT Qs includes a control terminal, an input terminal and an output terminal. The control terminal is connected with the gate line 121, the input terminal is connected with the data line 171 and the output terminal is connected with the driving TFT Qd and the storage capacitor Cst. In response to a scan signal applied to the gate line 121, the switching TFT Qs transmits a data signal, which is applied to the data line, to the driving TFT Qd.

The driving TFT Qd also includes a control terminal, an input terminal and an output terminal. The control terminal is connected with the output terminal of the switching TFT Qs, the input terminal is connected with the driving voltage line 172, and the output terminal is connected with the OLED LD. The driving TFT Qd provides an output current ILD having a magnitude which varies depending on the voltage between the control terminal and the output terminal of the driving TFT Qd.

The capacitor Cst is connected between the control terminal and the input terminal of the driving transistor Qd. The capacitor Cst charges a data signal applied to the control terminal of the driving TFT Qd and maintains the data signal even after the switching transistor Qs is turned off.

The OLED LD includes an anode connected with the output terminal of the driving TFT Qd and a cathode connected with a common voltage Vss. The OLED LD emit light with intensity which changes according to the output current ILD of the driving TFT Qd, to display an image.

The switching TFT Qs and the driving TFT Qd are n-channel electric field effect transistors ("FETs"). In alternative embodiments, at least one of the switching TFT Qs and the driving TFT Qd may be a p-channel FET. The connection relationship among the TFTs Qs and Qd, the capacitor Cst, and the OLED LD may change.

The OLED display as illustrated in FIG. 1 will be described with reference to FIGS. 2 and 3.

Figures 2, 3:
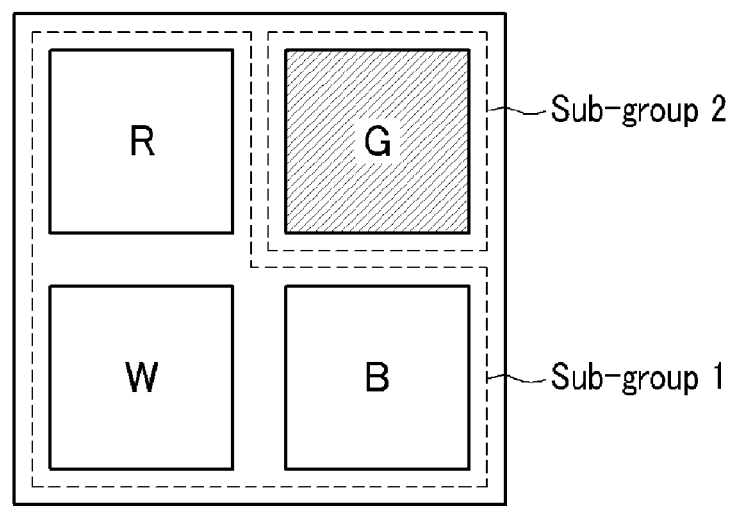
FIG. 2 is a top plan view showing disposition of a plurality of pixels in the OLED display according to an exemplary embodiment of the present invention.
FIG. 3 is an enlarged top plan view showing a single pixel group divided into two sub-pixel groups in the OLED display in FIG. 2.

FIG. 2 is a top plan view showing disposition of a plurality of pixels in the OLED display according to an exemplary embodiment of the present invention. FIG. 3 is an enlarged top plan view showing a single pixel group divided into two sub-pixel groups in the OLED display in FIG. 2.

With reference to FIGS. 2 and 3, red pixels (R) which display red color, green pixels (G) which display green color, blue pixels (B) which display blue color, and white pixels (W) are alternately arranged in the OLED display according an exemplary embodiment of the present invention. The red pixel (R), the green pixel (G) and the blue pixel (B) are primary pixels for expressing full colors, and the luminance thereof can be enhanced by including the white pixel (W).

The four pixels including the red pixel (R), the green pixel (G), the blue pixel (B) and the white pixel (W) may be grouped and repeated in rows or columns. The disposition of the pixels may vary from that illustrated in FIGS. 2 and 3.

Of the pixels, the red pixel (R), the blue pixel (B), and the white pixel (W) form a first sub-pixel group, and the green pixel (G) forms a second sub-pixel group. Unlike the first sub-pixel group, the second sub-pixel group includes a microcavity structure.

A more detailed structure of the OLED display as shown in FIGS. 2 and 3 will now be described with reference to FIG. 4.

Figure 4:
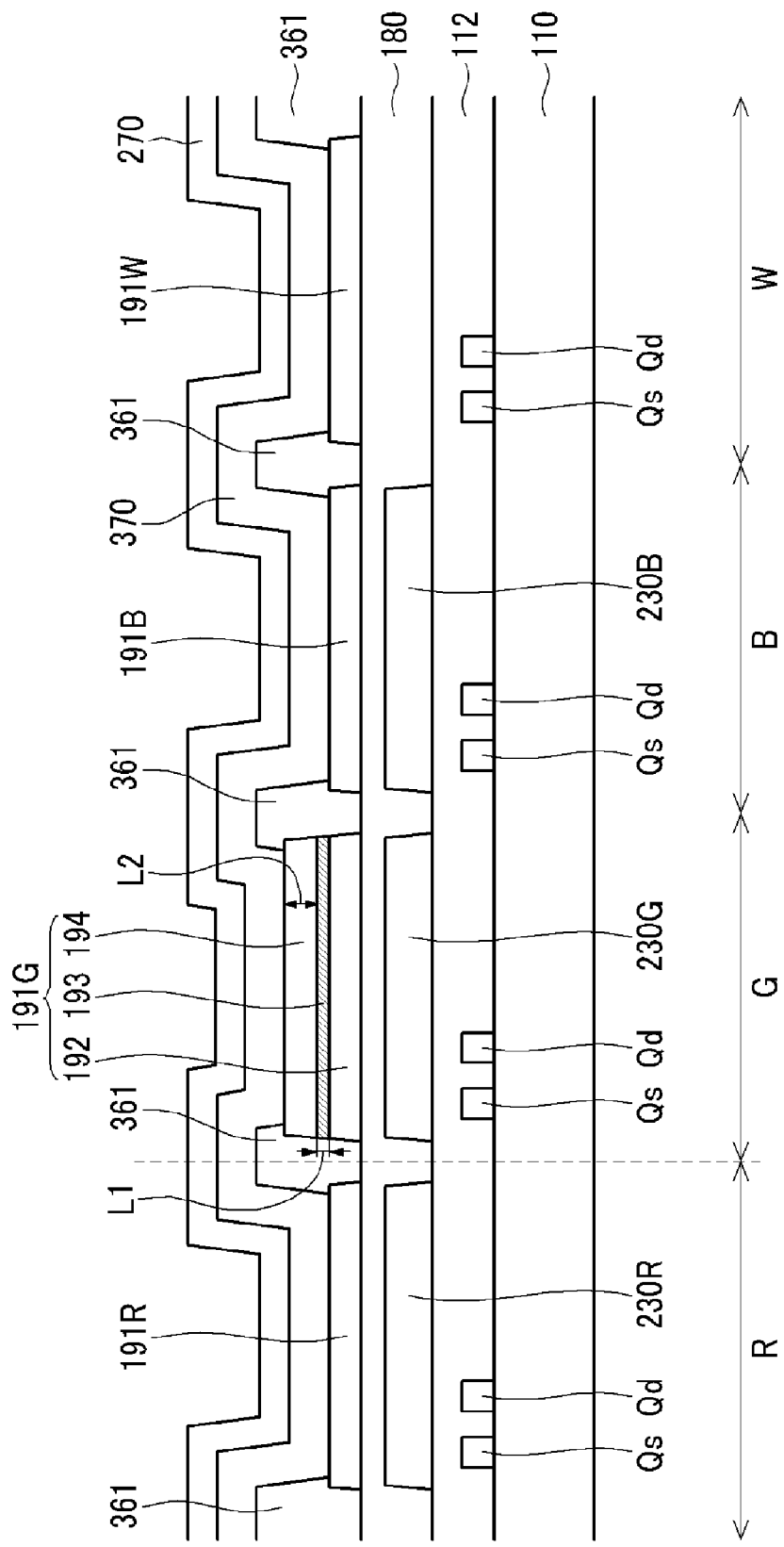
FIG. 4 is a cross-sectional view showing the OLED display according to an exemplary embodiment of the present invention.

FIG. 4 is a cross-sectional view showing the OLED display according to an exemplary embodiment of the present invention.

A plurality of TFT arrays are arranged on an insulating substrate 110. The TFT array includes the switching TFT Qs and the driving TFT Qd which are disposed at each pixel (PX). The switching TFT Qs and the driving TFT Qd are electrically connected to each other as described with respect to FIG. 1.

A lower insulating layer 112 is formed on the TFT arrays. The lower insulating layer 112 includes a plurality of contact holes (not shown) which expose portions of the switching TFTs Qs and the driving TFTs Qd.

A red filter 230R, a green filter 230G and a blue filter 230B are formed on the lower insulating layer 112, at the red pixel (R), the green pixel (G) and the blue pixel (B), respectively. No color filter is formed or a transparent filter (not shown) may be formed at the white pixel (W). The color filters 230R, 230G and 230B may be disposed according to a color filter on array ("CoA") method.

An upper insulating layer 180 is formed on the color filters 230R, 230G and 230B and on the lower insulating layer 112. The upper insulating layer 180 includes a plurality of contact holes (not shown).

Pixel electrodes 191R, 191G, 191B and 191W are formed on the upper insulating layer 180. The pixel electrodes 191R, 191G, 191B and 191W are electrically connected with the driving TFTs Qd via contact holes (not shown), and may serve as anodes.

The pixel electrodes 191R, 191B and 191W at the red pixel (R), the blue pixel (B) and the white pixel (W) are single layers made of a transparent conductor, respectively. Here, the transparent conductor may be a conductive oxide such as indium tin oxide ("ITO"), indium zinc oxide ("IZO"), zinc oxide ("ZnO"), etc. The pixel electrodes 191R, 191B and 191W may have a thickness of about 600 Å to about 1500 Å, respectively.

The pixel electrode 191G at the green pixel (G) is a triple-layer including a lower transparent conductive layer 192, a translucent conductive layer 193, and an upper transparent conductive layer 194. Here, the lower transparent conductive layer 192 and the upper transparent conductive layer 194 may be made of a conductive oxide such as ITO, IZO, ZnO, etc. The translucent conductive layer 193 may be made of a material having such properties which allow a portion of light to transmit therethrough and a portion of light to be reflected therefrom, and may be made of silver (Ag), aluminum (Al), gold (Au), nickel (Ni), magnesium (Mg), including alloys of the foregoing, etc., each with a thin thickness.

The lower transparent conductive layer 192 may be formed on the same layer on which the pixel electrodes 191R, 191B and 191W are formed, respectively, at the red pixel (R), the blue pixel (B) and the white pixel (W), and may have a thickness of about 600 Å to about 1500 Å. The lower transparent conductive layer 192 improves adhesion between the translucent conductive layer 193 and the upper insulating layer 180. In particular, because the upper insulating layer 180 includes the contact holes (not shown), if the translucent conductive layer 193 is directly formed on the contact holes, adhesion would deteriorate to possibly result in a disconnection between the TFTs and the pixel electrodes. The lower transparent conductive layer 192 may serve to avoid such a deficiency of adhesion.

The thickness L1 of the translucent conductive layer 193 is about 50 Å to about 300 Å, and the thickness L2 of the upper transparent conductive layer 194 is about 300 Å to about 2000 Å. The color purity and color reproducibility of the green pixel (G) can be improved by adjusting the thicknesses of L1 and L2. This will be described later.

A plurality of insulating members 361 which define each pixel are formed on and between the pixel electrodes 191R, 191B, 191G and 191W, and an organic light emitting member is formed on the plurality of insulation members 361 and on the pixel electrodes 191R, 191B, 191G and 191W.

The organic light emitting member may include an organic emission layer 370, and an auxiliary layer (not shown) which may improve emission efficiency of the organic emission layer 370.

The organic emission layer 370 may include a plurality of sub-emission layers (not shown) formed by sequentially stacking materials, each of which uniquely manifests red, green or blue light, and may emit white light by combining the colors of the plurality of sub-emission layers. The sub-emission layers may be formed to be horizontal, without being limited to being formed to be vertical, and various colors may be combined so long as they can manifest white light, without being limited to the red, green and blue colors.

The emission layer 370 may have such a structure in which the plurality of sub-emission layers are stacked repeatedly several times. That is, for example, a red sub-emission layer, a blue sub-emission layer and a green sub-emission layer may be sequentially stacked, on which a red sub-emission layer, a blue sub-emission layer and a green sub-emission layer are repeatedly stacked again.

The auxiliary layer may be one or more selected from among an electron transport layer, a hole transport layer, an electron injecting layer and a hole injecting layer.

A common electrode 270 is formed on the organic light emitting member. The common electrode 270 may be made of a metal having a high reflection factor, and serves as a cathode. The common electrode 270 is formed on the entire surface of the substrate 110, and makes a pair of electrodes with each of the pixel electrodes 191R, 191B, 191G and 191W serving as anodes to provide current to the organic emission layer 370.

In the exemplary embodiment of the present invention, the green pixel (G) includes a microcavity structure, while the red pixel (R), the blue pixel (B) and the white pixel (W) do not include such a microcavity structure.

The microcavity structure refers to a structure in which light is repeatedly reflected between a reflective layer and a translucent layer which are spaced apart by an optical path length to thus amplify light of a particular wavelength by constructive interference. Here, the common electrode 270 serves as the reflective layer, and the translucent conductive layer 193 serves as the translucent layer.

The common electrode 270 considerably modifies the illumination characteristics of light emitted from the organic emission layer 370. Of the modified light, light near the wavelength corresponding to a resonance wavelength of the microcavity is strengthened by the translucent conductive layer 193, and light of the other wavelengths is suppressed.

The microcavity will now be described with reference to FIGS. 15A to 18 along with FIG. 4.

Figure 15A:
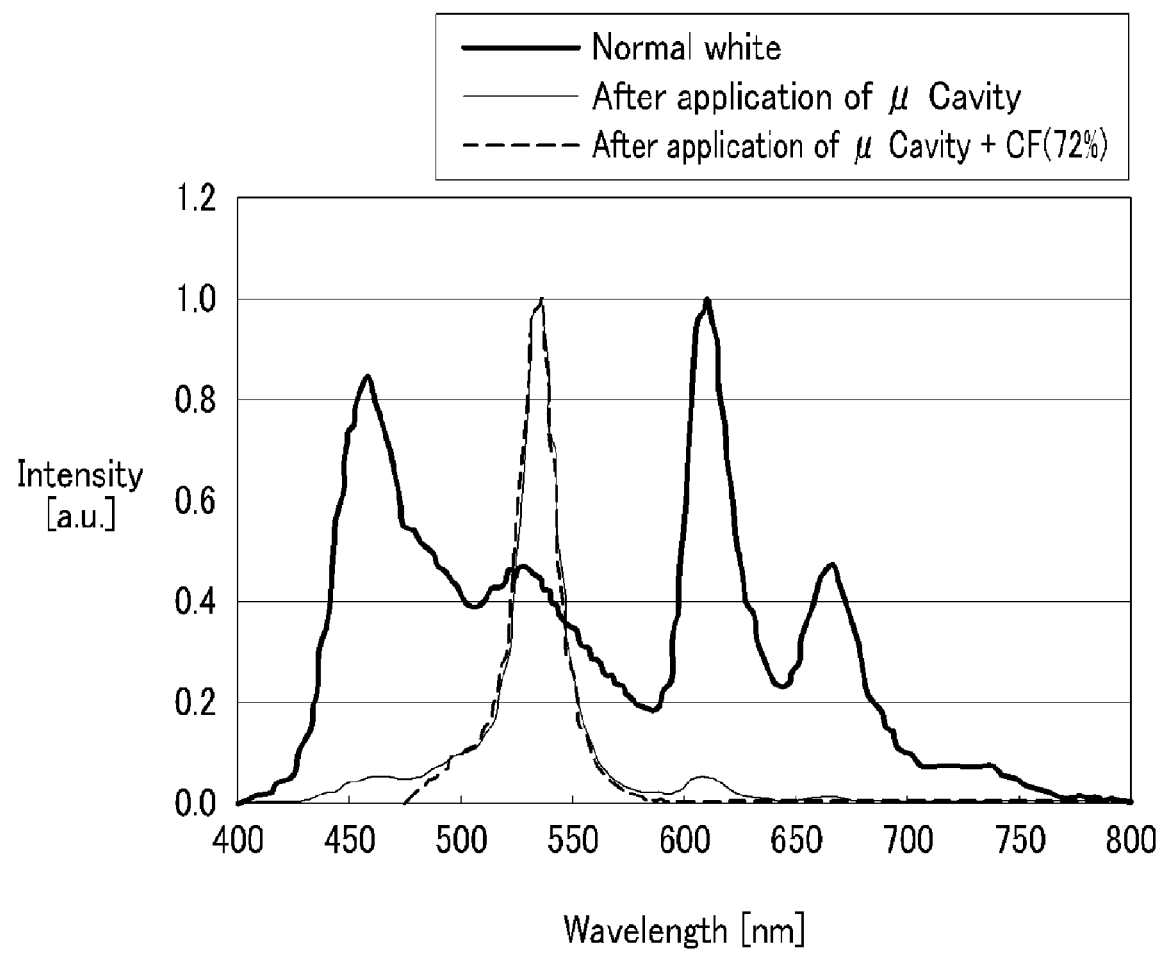
FIG. 15A is a graph showing an emission spectrum of the OLED display according to an exemplary embodiment of the present invention.
Figure 15B:
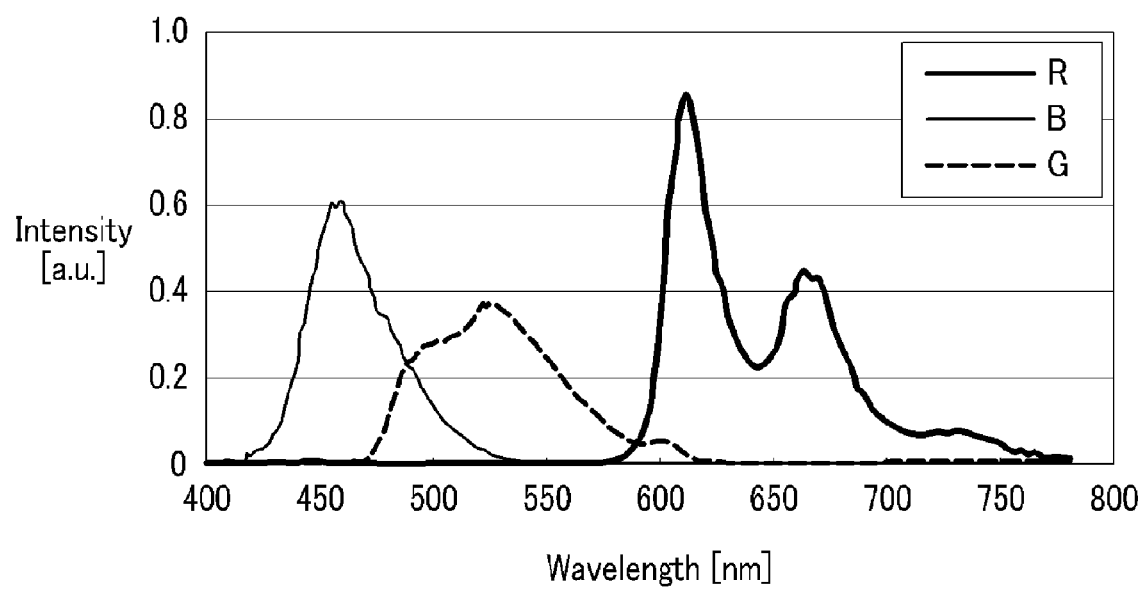
FIG. 15B is a graph showing an emission spectrum after white-emitted light passes through a color filter of the OLED display according to an exemplary embodiment of the present invention.
Figure 15C:
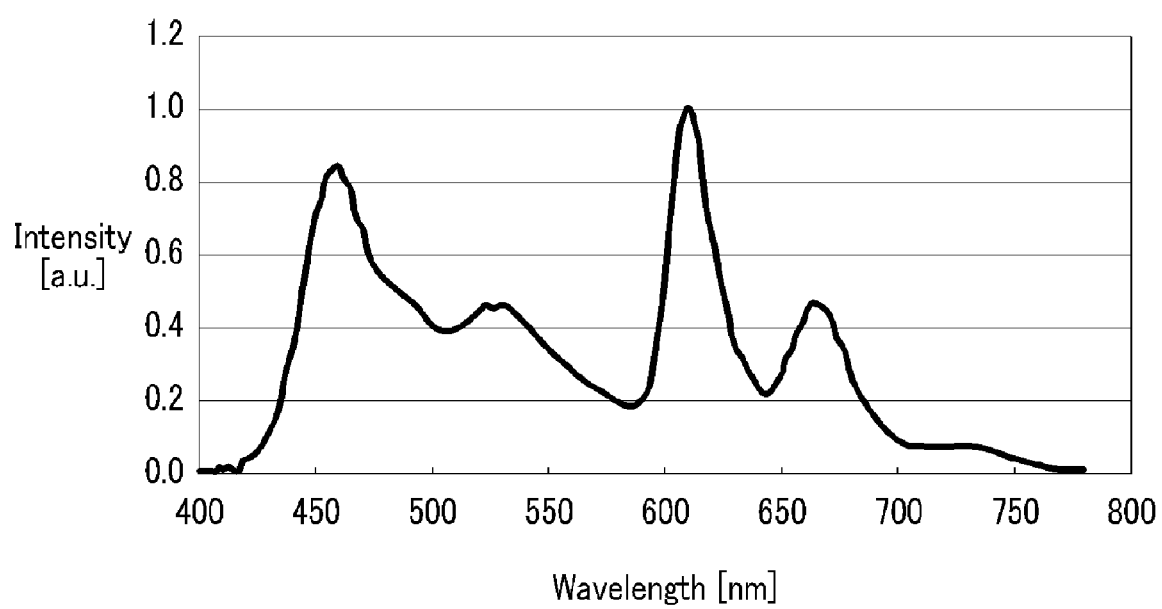
FIG. 15C is a graph showing an emission spectrum of light that is white-emitted from an emission layer of the OLED display according to an exemplary embodiment of the present invention.
Figure 16:
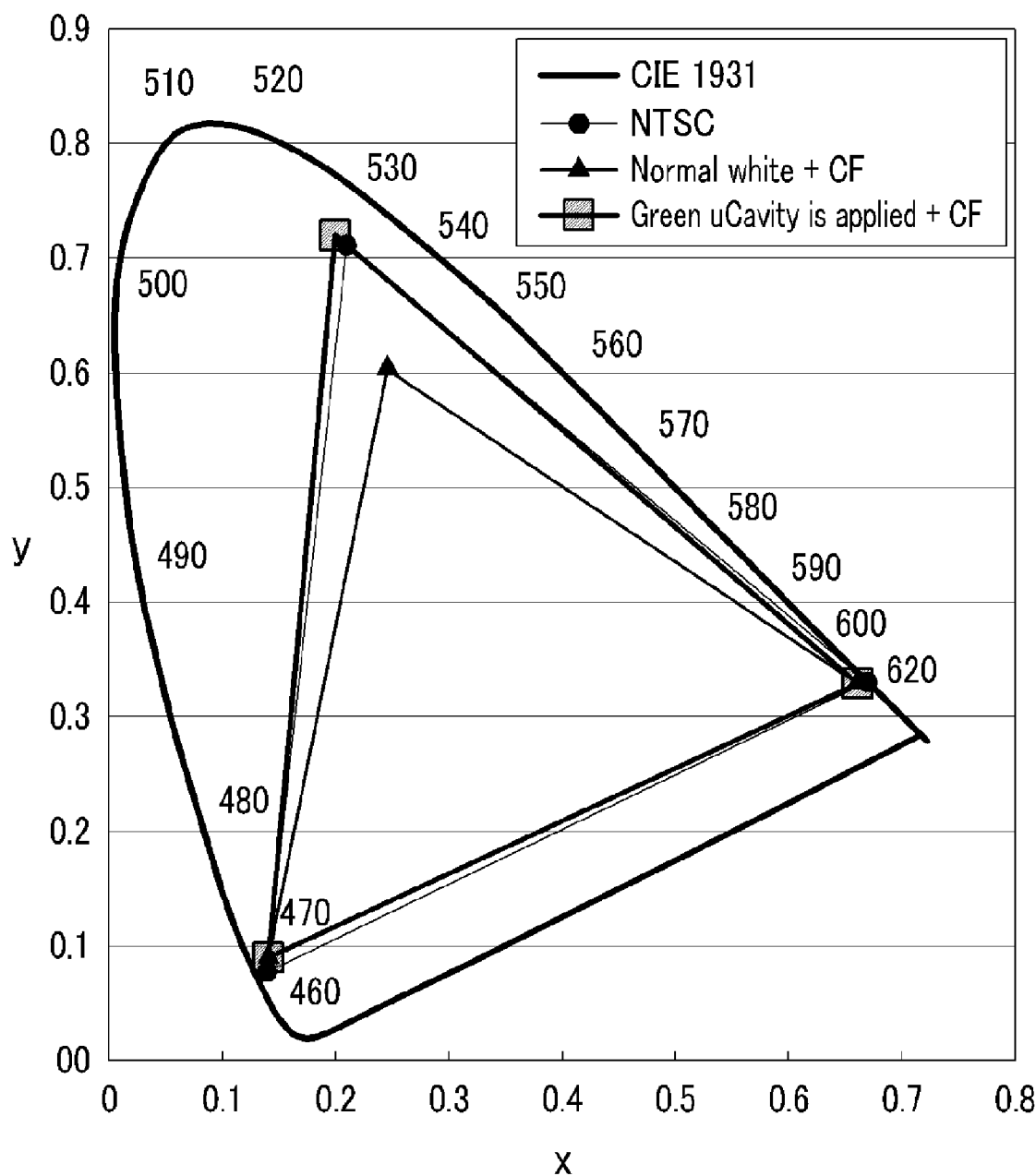
FIG. 16 is a graph of color coordinates showing color reproducibility of the OLED display according to an exemplary embodiment of the present invention.
Figure 17:
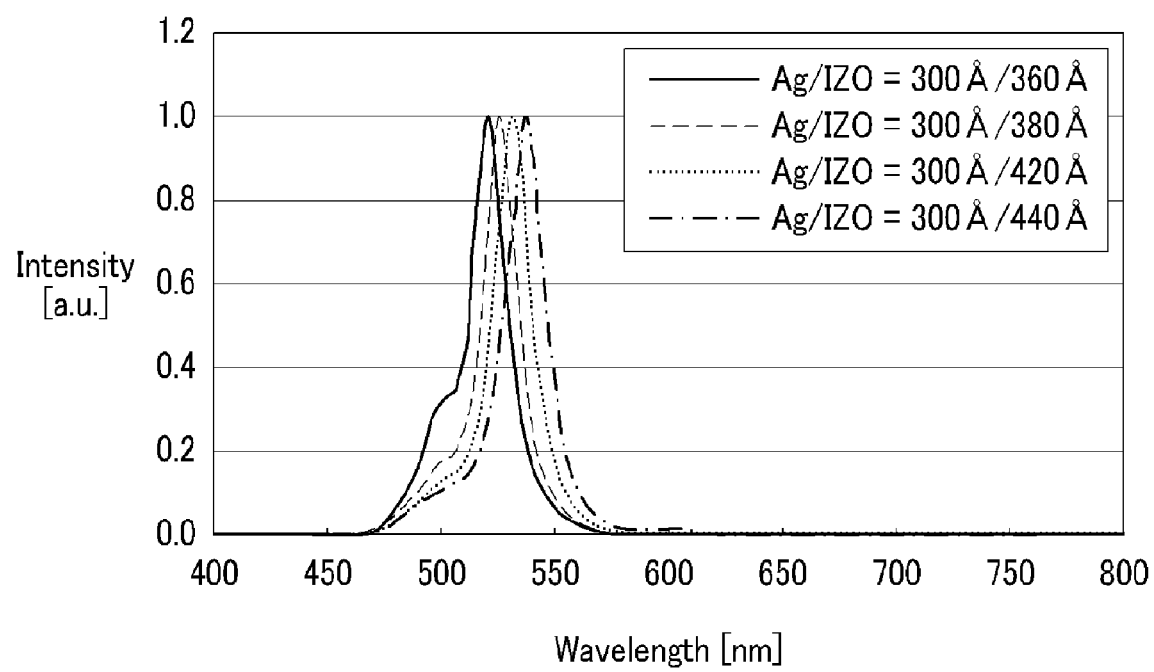
FIGS. 17 and 18 are graphs showing changes in positions of peak wavelengths when the thickness of an upper transparent conductive layer is changed in the OLED display according to an exemplary embodiment of the present invention.
Figure 18:
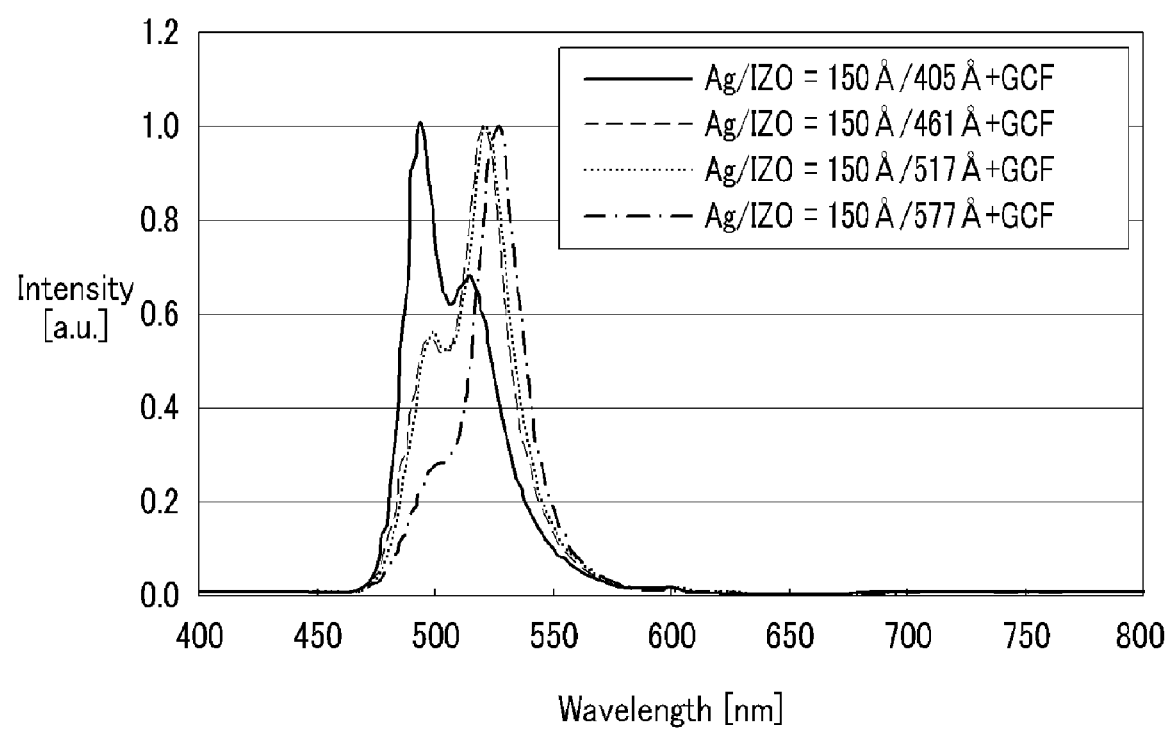

FIG. 15A is a graph showing an emission spectrum of the OLED display according to an exemplary embodiment of the present invention. FIG. 15B is a graph showing an emission spectrum after white-emitted light passes through a color filter of the OLED display. FIG. 15C is a graph showing an emission spectrum of light white-emitted from an emission layer 370 of the OLED display. FIG. 16 is a graph of color coordinates showing color reproducibility of the OLED display according to an exemplary embodiment of the present invention. FIGS. 17 and 18 are graphs showing changes in positions of peak wavelengths when the thickness of an upper transparent conductive layer 194 is changed in the OLED display according to an exemplary embodiment of the present invention.

First, with reference to FIG. 15C, white light emitted from the emission layer 370 exhibits emission spectrums having peaks near about 460 nm (blue region), near about 530 nm (green region), and near about 610 nm (red region). Of them, the spectrum of the green region extends in a wide wavelength range and overlaps with the spectrum of a long wavelength of the blue region, so their boundary is not clear.

With reference to FIG. 15B, when such white light passes through a color filter, the green emission spectrum transmits through the emission spectrum of the long wavelength of blue color, so color purity of green color is drastically degraded.

In the exemplary embodiment of the present invention, the microcavity structure is included in the green pixel (G), whereby light of a particular wavelength range of the green wavelength region can be amplified and light of the remaining wavelengths can be suppressed to thus form an emission spectrum of a narrow wavelength range.

With reference to FIG. 15A, it is noted that, when the green pixel (G) has the microcavity structure, white color-emitted light can be emitted with a high intensity at a narrow wavelength region of about 520 nm to about 550 nm. The fact that green light has such a narrow wavelength region means that the color purity and color reproducibility have been improved, and the high intensity means that light efficiency has been improved.

The green emission spectrum of such a narrow wavelength range is obtained as light of the narrow wavelength region of about 520 nm to about 550 nm and light of the other wavelength regions is suppressed, owing to the microcavity structure between the translucent conductive layer 193 at the green pixel (G) and the common electrode 270. Because such green emission spectrum does not overlap with the wavelength of the blue emission spectrum, the color purity and color reproducibility of the green color can be improved.

With reference to FIG. 16, assuming that an NTSC region has 100% color reproducibility, it can be noted that the structure having the microcavities only at the green pixel (G) according to the exemplary embodiment of the present invention has high color reproducibility of nearly 100%. This means that the color reproducibility is remarkably improved compared with the case where a structure without microcavities has about 72% color reproducibility.

A wavelength range of light strengthened in the microcavity structure may be determined depending on the optical path length. The optical path length may be determined by the thicknesses of the emission layer 370, the translucent conductive layer 193, and the upper transparent conductive layer 194. Because the emission layer 370 is formed on the entire surface under the same deposition conditions, it can be assumed that the thickness of the emission layer 370 is uniform. Thus, the optical path length can be adjusted with the thickness of the translucent conductive layer 193 and the upper transparent conductive layer 194.

In further detail, the thickness of the upper transparent conductive layer 194 determines a peak position in the emission spectrum.

With reference to FIG. 17, in the structure in which a single white emission layer formed by sequentially stacking the red sub-emission layer, the green sub-emission layer and the blue sub-emission layer is used as the emission layer 370, when the thickness of the translucent conductive layer 193 made of silver (Ag) was fixed as about 300 Å while the thickness of the upper transparent conductive layer 194 was changed to be about 360 Å, 380 Å, 420 Å and 440 Å, respectively, it is noted that the position of the peak wavelength of the green emission region moved toward the long wavelength.

Likewise, with reference to FIG. 18, in the structure in which a dual-white emission layer formed by stacking the red sub-emission layer, the green sub-emission layer and the blue sub-emission layer twice is used as the emission layer 370, when the thickness of the translucent conductive layer 193 made of silver (Ag) was fixed as about 150 Å while the thickness of the upper transparent conductive layer 194 was changed to be about 405 Å, 461 Å, 517 Å and 577 Å, respectively, it is noted that the position of the peak wavelength of the green emission region moved toward the long wavelength.

In this manner, it can be noted that the peak wavelength of the emission spectrum is determined by adjusting the thickness of the upper transparent conductive layer 194. In the exemplary embodiment of the present invention, the peak can be formed at the green wavelength region when the upper transparent conductive layer 194 has the thickness of about 300 Å to 2000 Å. In particular, when the upper transparent conductive layer 194 has a thickness of about 450 Å to 700 Å, the peak wavelength can be shown at an optimum position of about 520 nm to about 550 nm.

The thickness of the translucent conductive layer 193 determines the width of the emission spectrum. The width of the emission spectrum determines how wide the range of wavelength of the emission spectrum appears. When the emission spectrum extends with a wide width, the color purity and color reproducibility are degraded, whereas when the emission spectrum appears sharply with a narrow width, high color purity and high color reproducibility can be obtained. In the exemplary embodiment of the present invention, if the translucent conductive layer 193 has a thickness of about 50 Å to about 300 Å, a sharp green spectrum with a narrow width can be obtained.

In the OLED display using the white emission layer and the color filters according to the exemplary embodiment of the present invention, because the green pixel (G) has the microcavity structure, light of the narrow wavelength can be strengthened while light of the other wavelength regions can be suppressed, and thus the color purity and color reproducibility can be improved. In addition, by adjusting the thickness of the translucent conductive layer and the transparent conductive layer at the green pixel, the spectrum having a peak of a desired wavelength range can be obtained and the color purity can be enhanced.

A method for manufacturing the OLED display in FIG. 4 will now be described with reference to FIGS. 5 to 14.

FIGS. 5 to 14 are cross-sectional views sequentially showing a method for manufacturing the OLED display in FIG. 4 according to an exemplary embodiment of the present invention.

Here, only the red pixel (R) and the green pixel (G) are shown for the sake of clarity, but as described above, the red pixel (R), the green blue pixel (B) and the white pixel (W) belong to the first sub-group which does not have the microcavity structure, so the blue pixel (B) and the white pixel (W) can be formed in the same manner as that of the red pixel (R).

Figure 5:
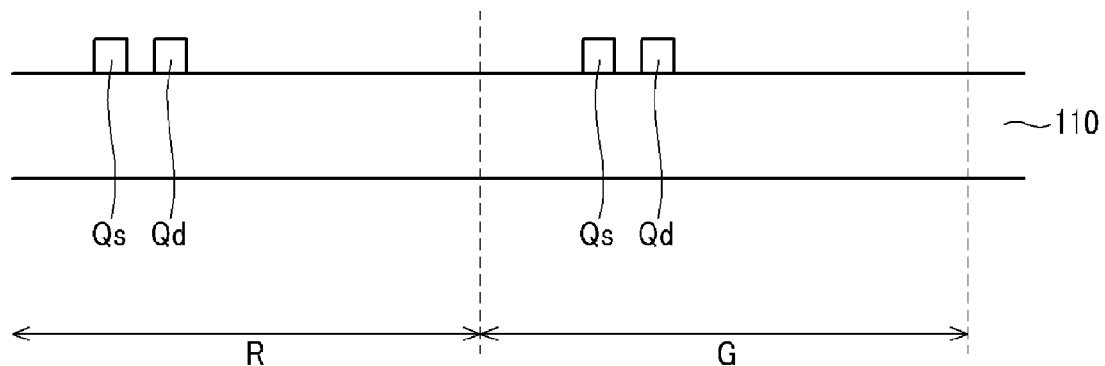
FIGS. 5 to 14 are cross-sectional views sequentially showing a method for manufacturing the OLED display in FIG. 4 according to an exemplary embodiment of the present invention.

As shown in FIG. 5, a plurality of switching TFTs Qs and a plurality of driving TFTs Qd are formed on the insulating substrate 110. Here, the forming of the switching TFTs Qs and the driving TFTs Qd includes stacking and patterning a conductive layer, an insulating layer and a semiconductor layer.

Figure 6:
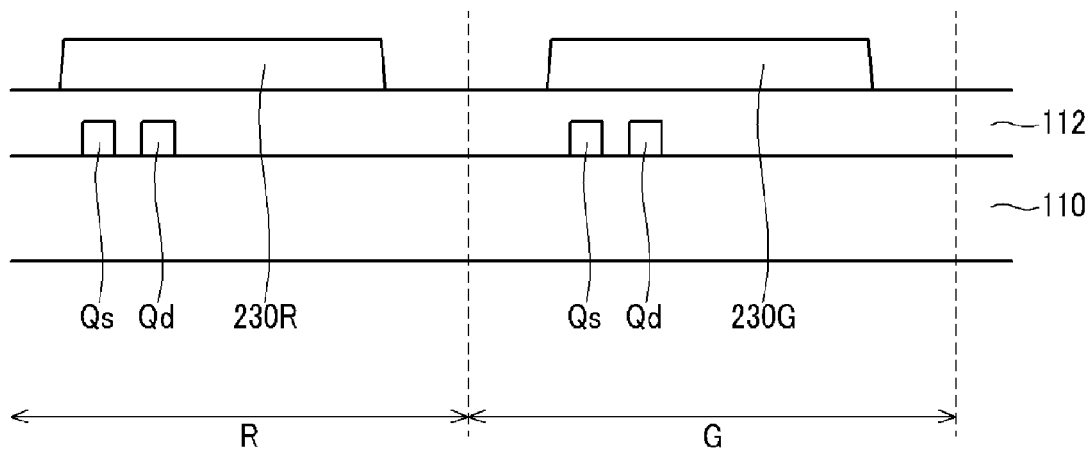

Next, as shown in FIG. 6, the lower insulating layer 112 is formed on the switching TFTs Qs, the driving TFTs Qd and the substrate 110, and then patterned to form a plurality of contact holes (not shown).

Then, as shown in FIG. 6, the color filters 230R and 230G are formed on the lower insulating layer 112.

Thereafter, the upper insulating layer 180 is formed on the lower insulating layer 112 and on the color filters 230R and 230G. The upper insulating layer 180 is then patterned to form a plurality of contact holes (not shown).

Figure 7:
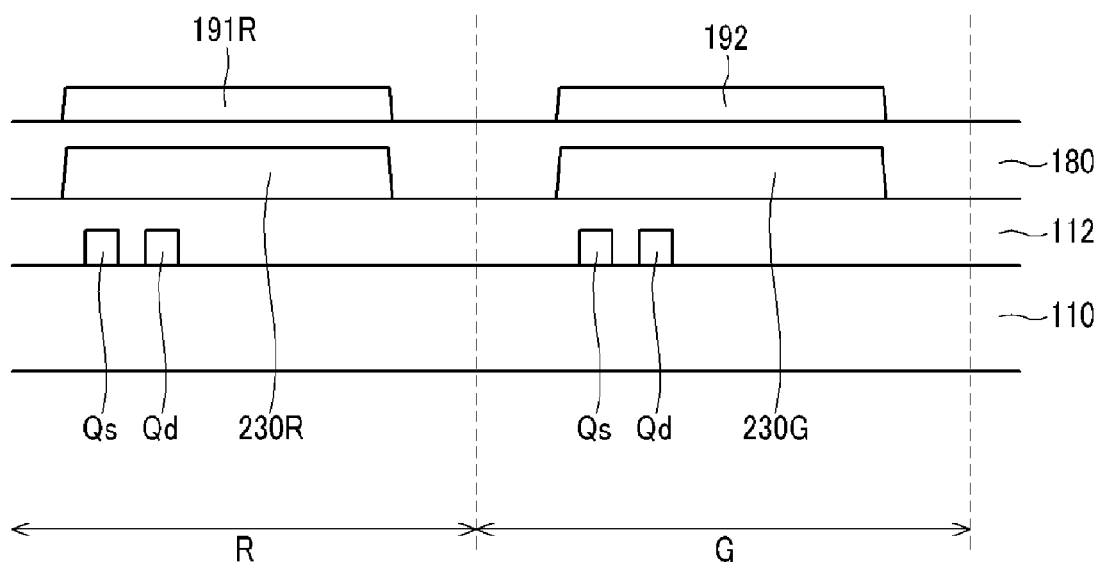

Subsequently, as shown in FIG. 7, a transparent conductive layer is deposited on the upper insulating layer 180, on which a photolithography process is performed to form the pixel electrode 191R at the red pixel (R) and the lower transparent conductive layer 192 at the green pixel (G).

Figure 8:
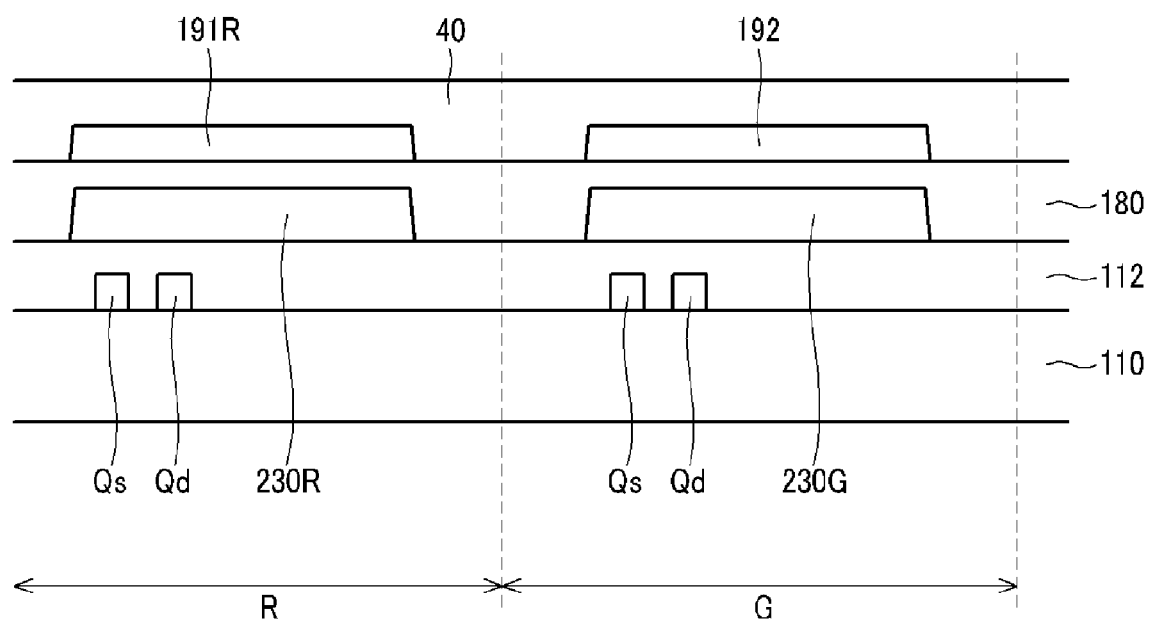

As shown in FIG. 8, a first photosensitive film 40 is then coated on the entire surface of the substrate including the pixel electrode 191R, the lower transparent conductive layer 192 and the upper insulating layer 180.

Figure 9:
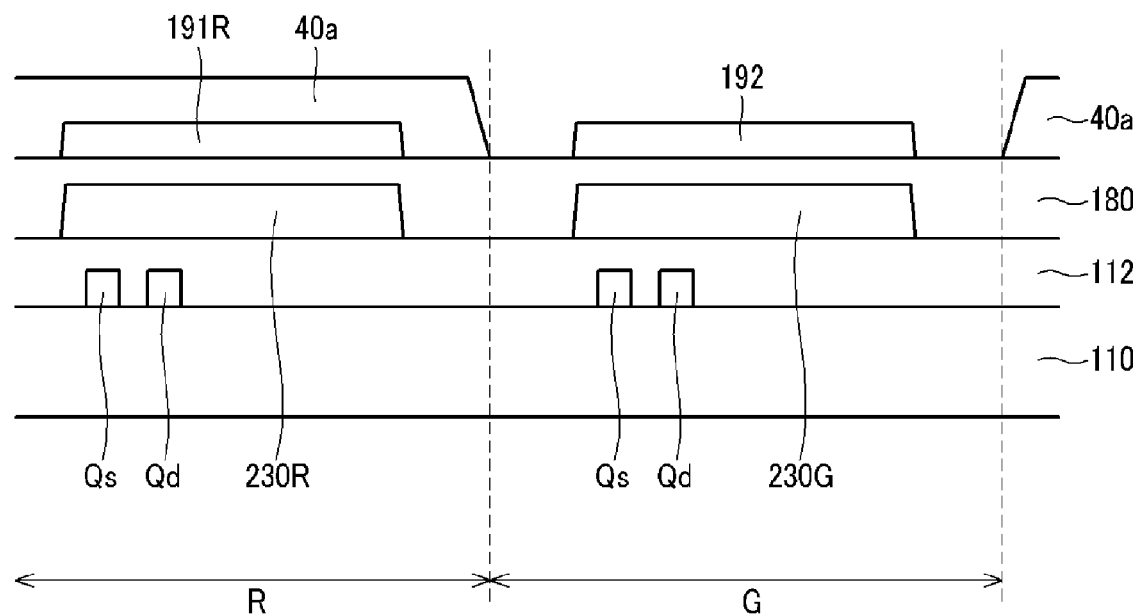

And, as shown in FIG. 9, the first photosensitive film 40 is patterned to form a first photosensitive pattern 40a. The first photosensitive pattern 40a includes a plurality of openings 45 exposing a portion of the green pixel (G) and the lower transparent conductive layer 192.

Figure 10:
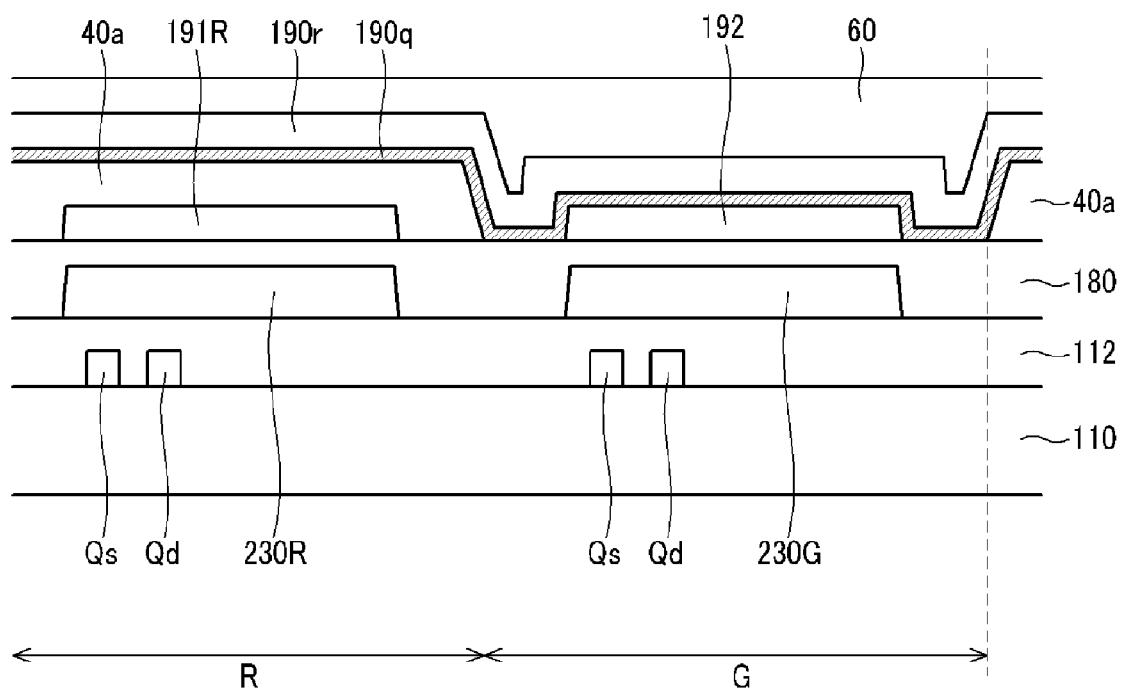

As shown in FIG. 10, a translucent conductive layer 190q and an upper transparent conductive layer 190r are sequentially stacked on the entire surface of the substrate including the first photosensitive pattern 40a and the lower transparent conductive layer 192, on which a second photosensitive film 60 is then coated.

Figure 11:
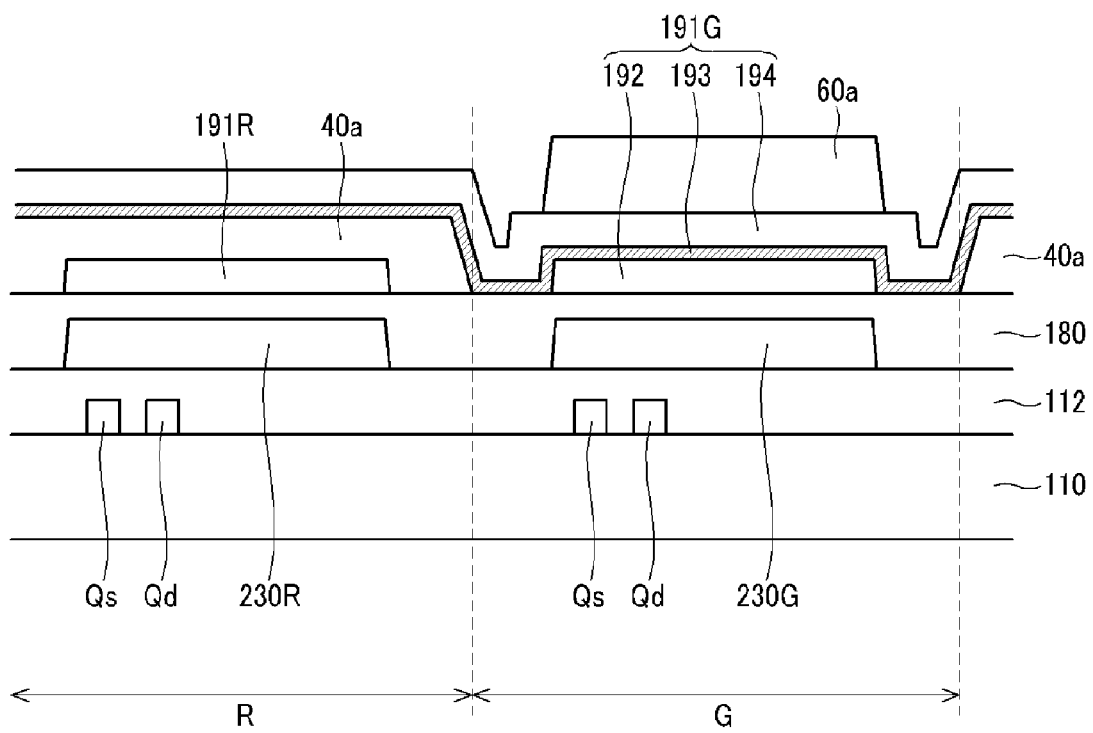

Thereafter, as shown in FIG. 11, the second photosensitive film 60 is patterned to form a second photosensitive pattern 60a at the opening 45.

Figure 12:
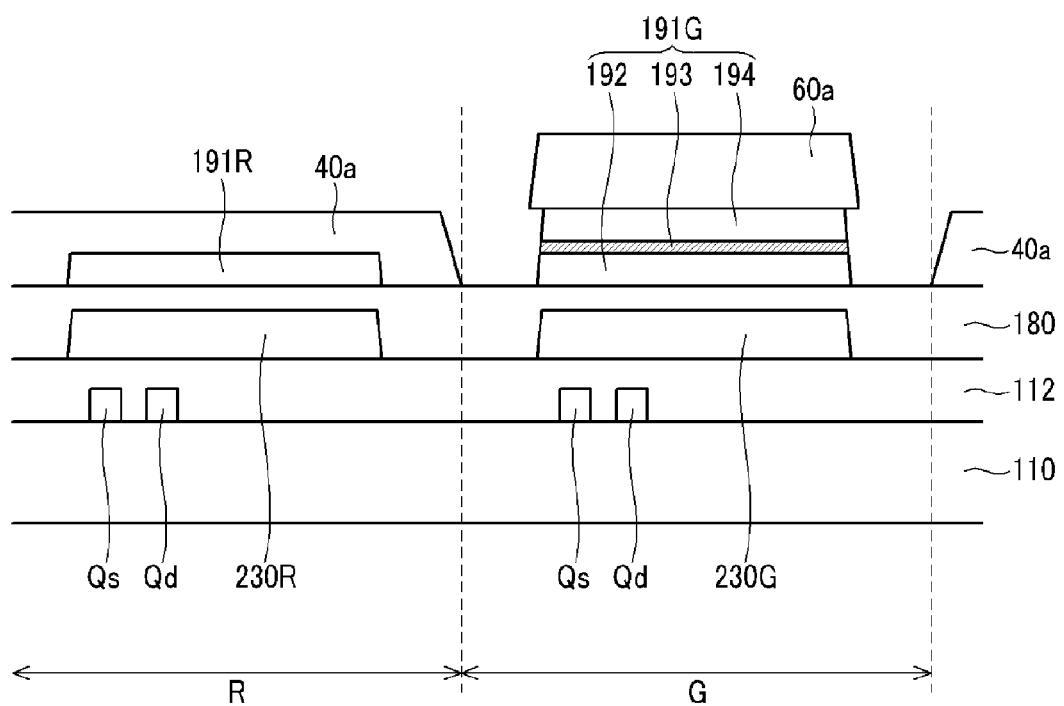

And then, as shown in FIG. 12, the upper transparent conductive layer 190r and the translucent conductive layer 190q (FIG. 10) are etched through photolithography by using the second photosensitive pattern 60a as a mask to form a translucent conductive layer 193 and an upper transparent conductive layer 194 which are positioned on the lower transparent conductive layer 192. The lower transparent conductive layer 192, the translucent conductive layer 193 and the upper transparent conductive layer 194 form the pixel electrode 191G of the green pixel (G).

Figure 13:
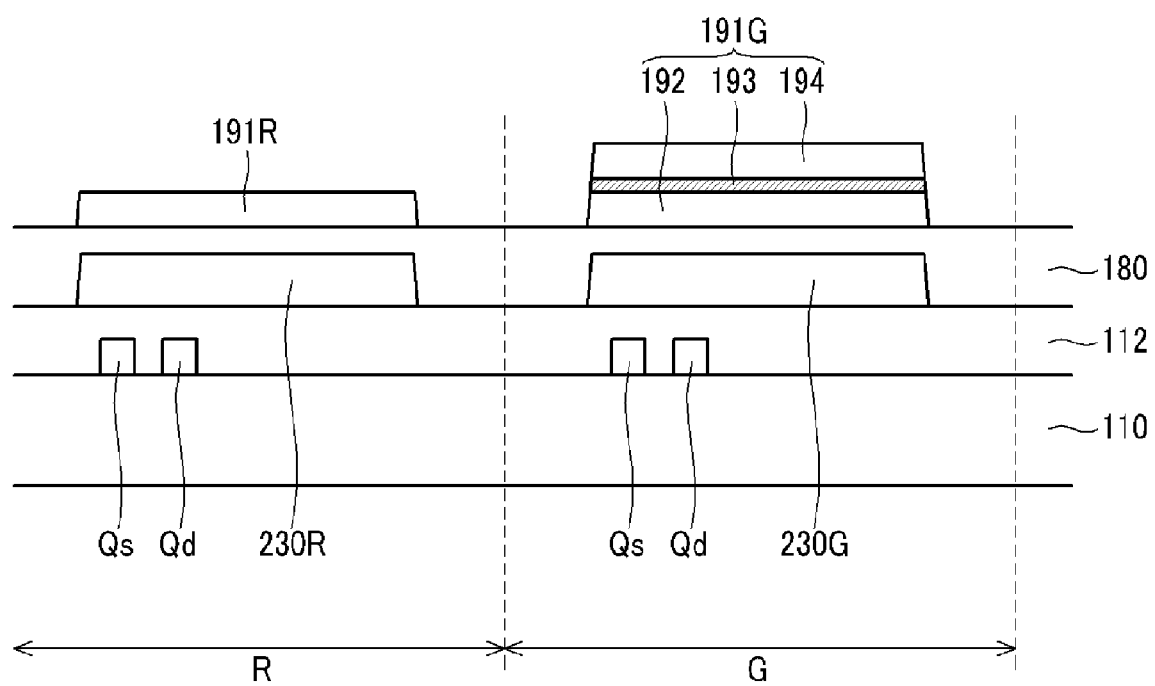

As shown in FIG. 13, the first photosensitive pattern 40a (FIG. 12) at the red pixel (R) and the second photosensitive pattern 60a (FIG. 12) at the green pixel (G) are simultaneously removed.

Figure 14:
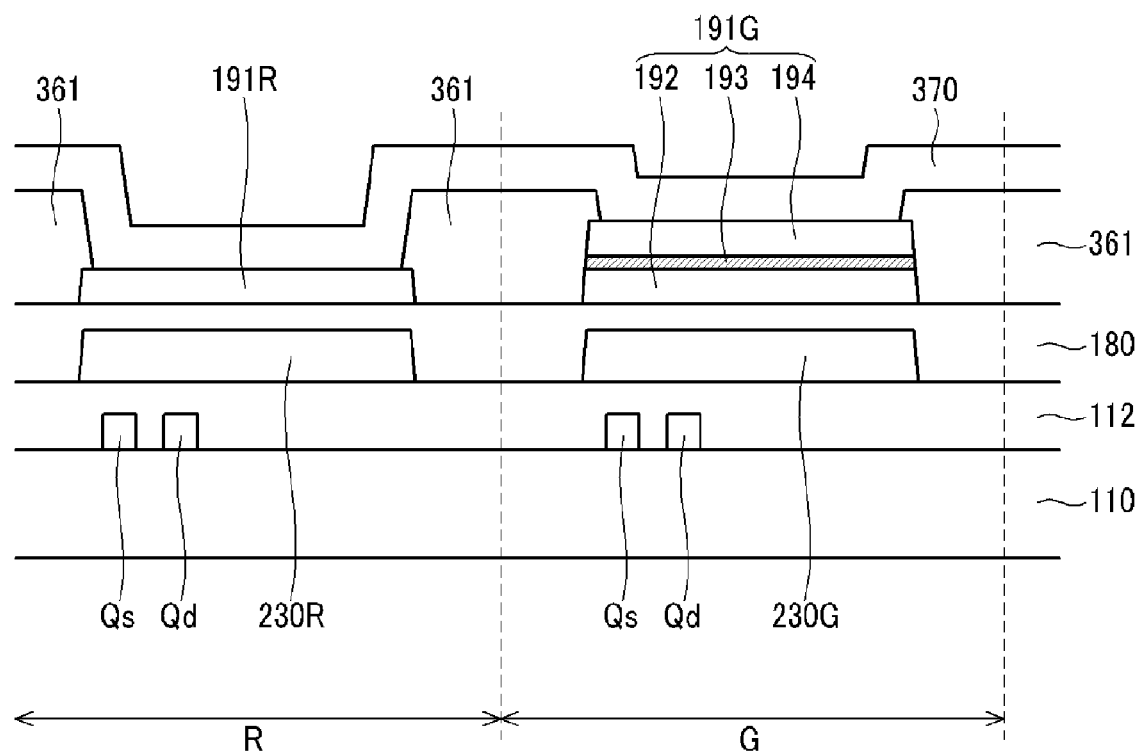

As shown in FIG. 14, an insulating layer is coated on the pixel electrodes 191R and 191G and on the upper insulating layer 180 and then patterned to form an insulating layer 361 having a plurality of openings exposing the pixel electrodes 191R and 191G.

The emission layer 370 is then formed by sequentially stacking a red emission layer (not shown), a blue emission layer (not shown) and a green emission layer (not shown) on the entire surface of the substrate 110. In this case, the red emission layer, the blue emission layer and the green emission layer may be repeatedly stacked two or more times.

Subsequently, the common electrode 270 (FIG. 4) is formed on the emission layer 370.

Figure 19:
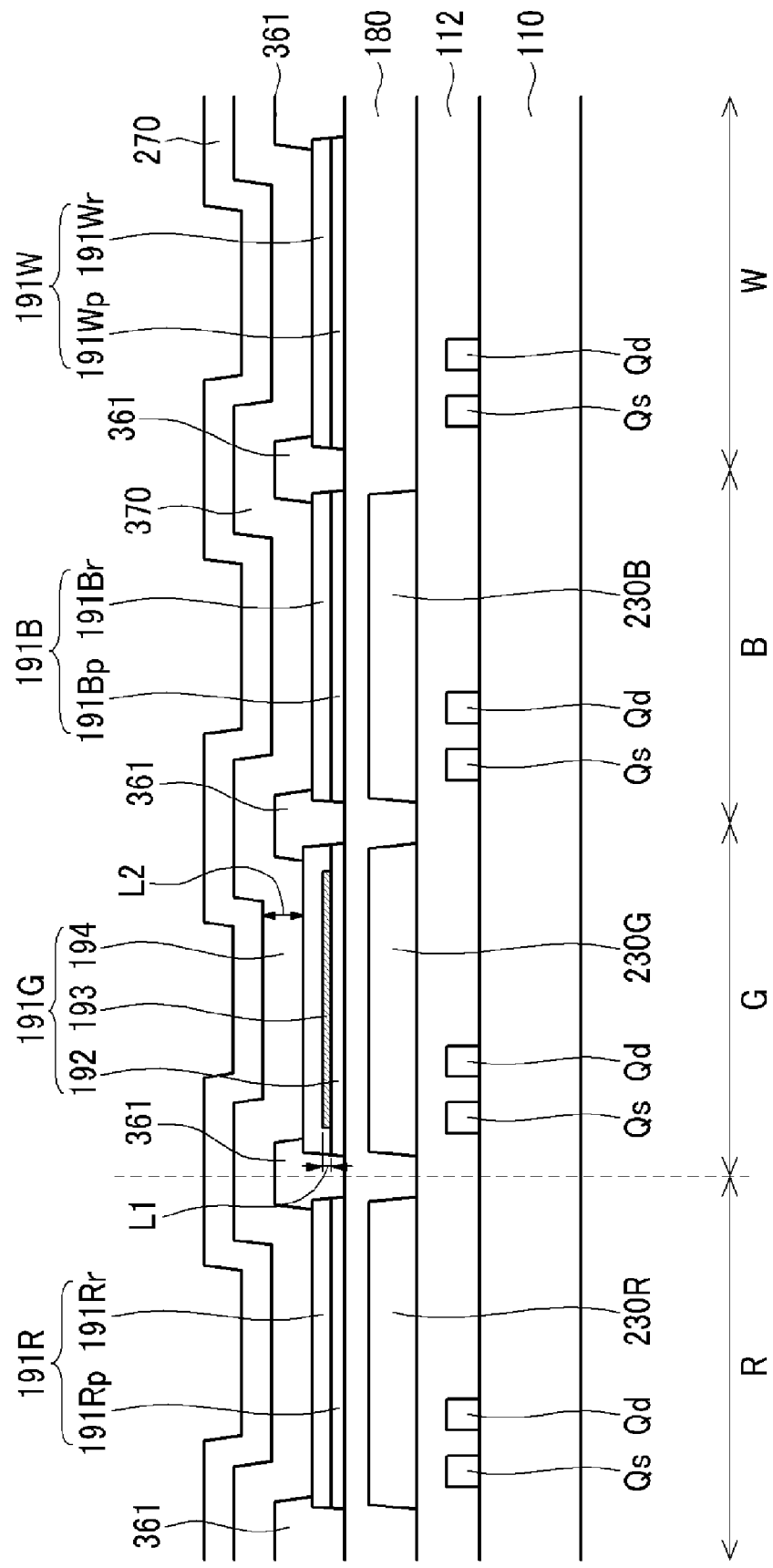
FIG. 19 is a cross-sectional view of an OLED display according to another exemplary embodiment of the present invention.

FIG. 19 is a cross-sectional view of an OLED display according to another exemplary embodiment of the present invention.

Hereinafter, the following descriptions cover parts of the current exemplary embodiment which are different from those of the exemplary embodiment of FIG. 4.

With reference to FIG. 19, a translucent conductive layer 193 which forms a pixel electrode 191G of a green pixel G is completely surrounded by an upper transparent conductive layer 194 and a lower transparent conductive layer 192. That is, the upper transparent conductive layer 194 covers an upper plane and a side plane defining the translucent conductive layer 193 formed on the lower transparent conductive layer 192.

Pixel electrodes 191R, 191B and 191W of a red pixel R, a blue pixel B, and a while pixel W, respectively, and a lower transparent conductive layer 192 and an upper transparent conductive layer 194 of a green pixel G, may be made of silver (Ag), aluminum (Al), gold (Au), nickel (Ni), magnesium (Mg), alloys of the foregoing, etc. For example, the lower transparent conductive layer 192 and the upper transparent conductive layer 194 may be made of IZO, and the translucent conductive layer 193 may be made of silver (Ag).

In addition, a sum of the thickness of the upper transparent conductive layer 194 and the thickness of a lower transparent conductive layer 193 which form a pixel electrode 191G of the green pixel G is substantially equivalent to the thickness of the pixel electrode 191R of the red pixel R, the thickness of the pixel electrode 191B of the blue pixel B and the thickness of the pixel electrode W of the white pixel W. The pixel electrodes 191R, 191B and 191W of the red pixel R, the blue pixel B and the white pixel W, respectively, include lower layers 191Rp, 191Bp and 191Wp and upper layers 191Rr, 191Br and 191Wr, respectively. The thickness of each of the lower layers 191Rp, 191Bp and 191Wp is substantially equivalent to that of the lower transparent conductive layer 192 of the green pixel G. The thickness of each of the upper layers 191Rr, 191Br and 191W is substantially equivalent to that of the upper transparent conductive layer 194 of the green pixel G. Here, the lower layers 191Rp, 191Bp and 191Wp and the lower transparent conductive layer 192 of the green pixel G may have a thickness of about 100 Å to about 500 Å, and the upper layers 191Rr, 191Br and 191Wr and the upper transparent conductive layer 194 of the green pixel G may have a thickness of about 400 Å to about 800 Å. A sum of the thickness of the lower layers 191Rp, 191Bp and 191Wp and the thickness of the upper layers 191Rr, 191Br and 191Wr may be about 700 Å to about 1100 Å. Green light may increase when the upper transparent conductive layer 194 has a thickness of about 400 Å to about 800 Å, and particularly, the increase in green light may be maximized when the upper transparent conductive layer 194 has a thickness of about 600 Å. The pixel electrodes 191R, 191B and 191W formed by overlapping the lower layers 191Rp, 191Bp and 191Wp and the upper layers 191Rr, 191Br and 191Wr serve as an anode. The lifespan and efficiency of the anode can be improved when the pixel electrodes 191R, 191B and 191W have a thickness of about 700 Å to about 1100 Å. In particular, the lifespan and efficiency of the anode can be maximized when the pixel electrodes 191R, 191B and 191W have a thickness of about 900 Å.

As described, when a microcavity structure is formed in the green pixel G, only green light can be amplified by constructive interference while light generated from the emission layer 370 is iteratively reflected between the common electrode 270 and the translucent conductive layer 193. Accordingly, color reproducibility of the OLED display can be improved.

Table 1 shows color reproducibility comparison between a case in which the microcavity structure is applied (present) and a case in which the microcavity structure is not applied (not present). The translucent conductive layer 193 is made of Ag and the upper transparent conductive layer 194 and the lower transparent conductive layer 192 are made of IZO, and IZO2 implies the upper transparent conductive layer 194. Color gamut (CG) denotes color reproducibility.

ity structure is applied. In particular, the color reproducibility is over 100% when the thickness of the upper transparent conductive layer 194 is about 577 Å or 637 Å. That is, the color reproducibility is improved when the microcavity structure is applied, and is significantly improved when the upper transparent conductive layer 194 has a thickness of about 550 Å to about 650 Å.

A method for manufacturing the OLED display of FIG. 19 will be described with reference to FIGS. 20 to 26.

FIGS. 20 to 26 sequentially show cross-sectional views of a manufacturing process of the OLED display of FIG. 19 according to an exemplary embodiment of the present invention.

Although only a red pixel R and a green pixel G are illustrated for convenience of description, a red pixel R, a blue pixel B and a white pixel W are grouped in a first sub-group 1 which does not employ the microcavity structure as described above, and therefore the blue pixel B and the white pixel W can be formed by the same method as that of the red pixel R.

Figure 20:
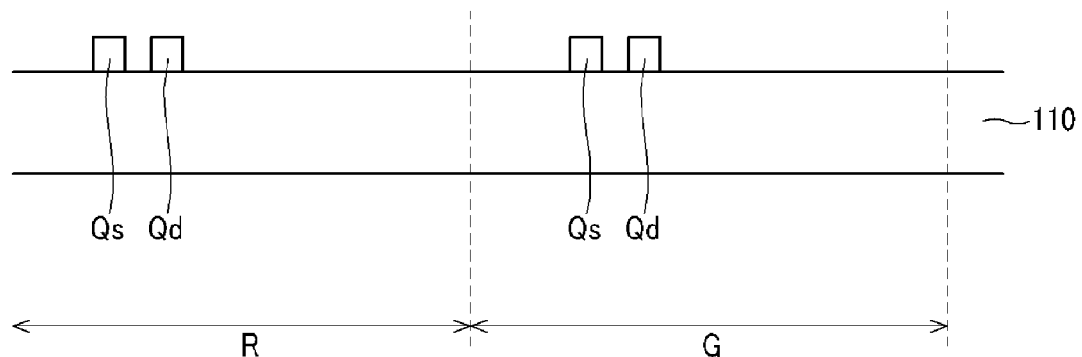
FIGS. 20 to 26 sequentially show cross-sectional views of a method of manufacturing the OLED display of FIG. 19 according to another exemplary embodiment of the present invention.

Referring to FIG. 20, a plurality of switching thin film transistors ("TFTs") Qs and a plurality of driving TFTs Qd are formed on an insulation substrate 110. Here, the forming of the switching TFT Qs and the driving TFT Qd include laminating and patterning of a conductive layer, an insulation layer and a semiconductor layer.

Figure 21:
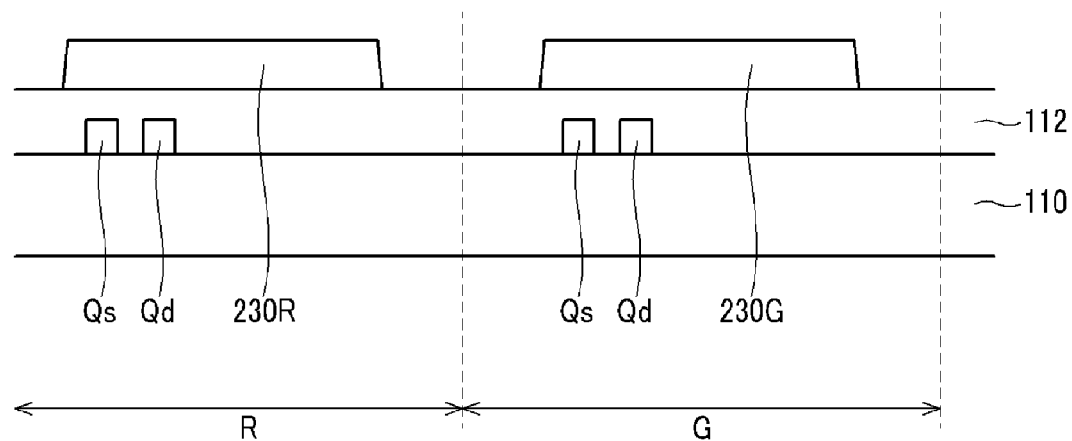

Referring to FIG. 21, a lower insulating layer 112 is stacked and patterned on the switching TFT Qs and the driving TFT Qd so that a plurality of contact holes (not shown) are formed.

Subsequently, a plurality of color filters 230R and 23G are formed on the insulating layer 112.

Figure 22:
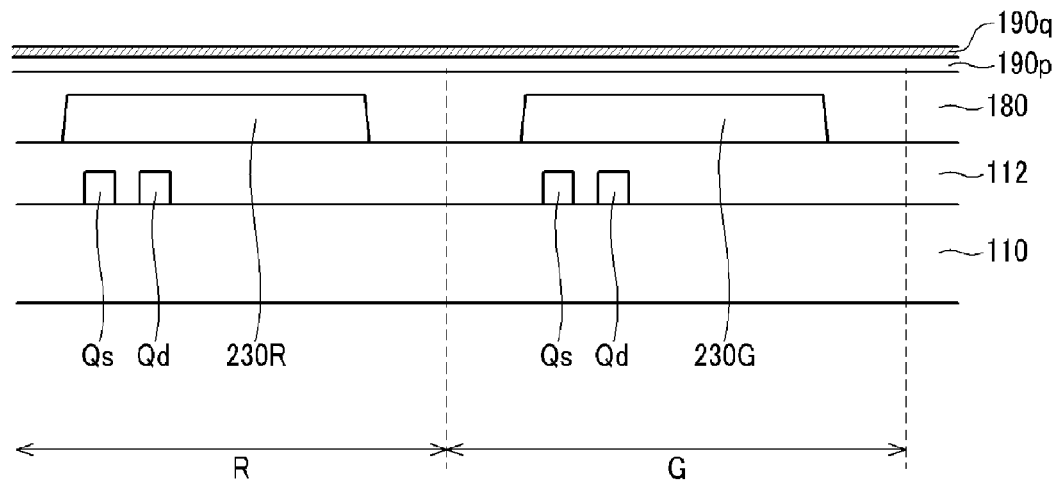

Referring to FIG. 22, an upper insulating layer 180 is stacked and patterned on the lower insulating layer 112 and the color filters 230R and 230G so that a plurality of contact holes (not shown) are formed.

Subsequently, a lower transparent conductive layer 190*p* and a translucent conductive layer 190*q* are sequentially stacked on the upper insulating layer 180.

Figure 23:
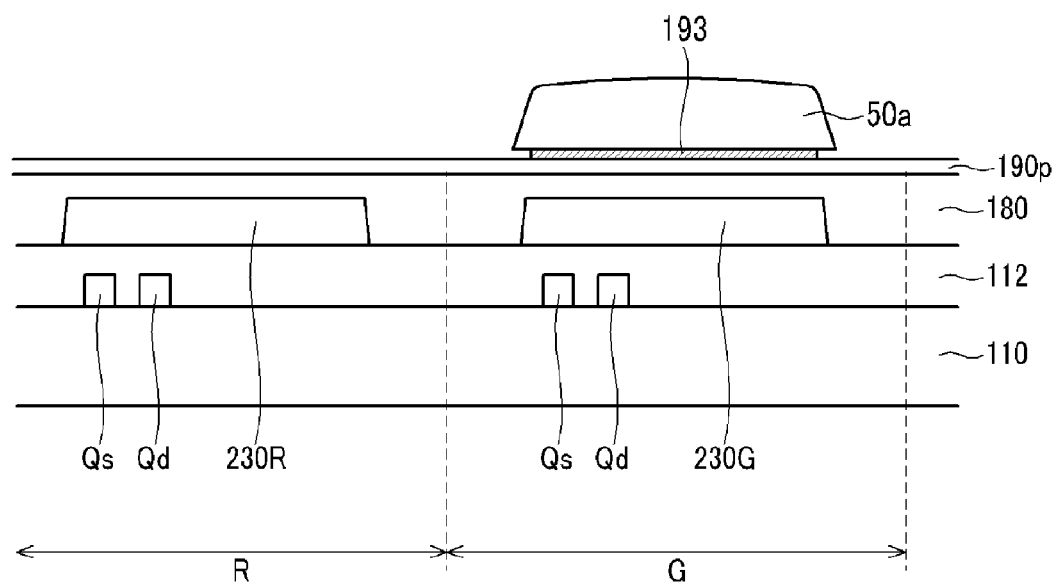
Figure 24:
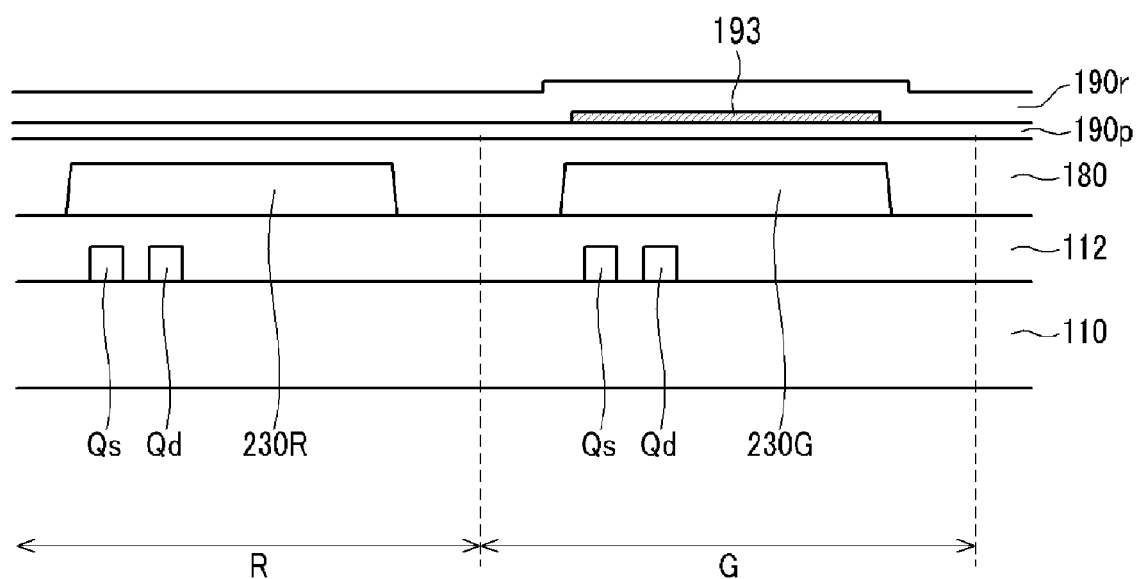

Referring to FIG. 23, a photosensitive film is formed and patterned on the translucent conductive layer 190*q* so that a first photosensitive film pattern 50*a* is formed. The first photosensitive film pattern 50*a* is formed only in a green pixel G, as illustrated in FIG. 23.

The translucent conductive layer 190*q* is etched using the translucent conductive layer 190*q* as a mask so that a translucent conductive layer 193 is formed. Next, referring to FIG. 24, a remaining first photosensitive film pattern 50*a* is removed, and an upper transparent conductive layer 190*r* is deposited on the translucent conductive layer 193.

TABLE 1

| Micro Cavity | Ag (Å) | IZO2 (Å) | R | | G | | B | | W | | CG (%) |
|---|---|---|---|---|---|---|---|---|---|---|---|
| | | | x | y | x | y | x | y | x | y | |
| Not Applied | 0 | 900 | 0.664 | 0.334 | 0.218 | 0.623 | 0.131 | 0.088 | 0.282 | 0.298 | 83 |
| Applied | 100 | 577 | 0.667 | 0.330 | 0.184 | 0.724 | 0.130 | 0.085 | 0.280 | 0.270 | 104 |
| | 160 | 637 | 0.667 | 0.332 | 0.179 | 0.738 | 0.131 | 0.082 | 0.277 | 0.267 | 107 |
| | 160 | 697 | 0.662 | 0.330 | 0.263 | 0.695 | 0.130 | 0.086 | 0.274 | 0.268 | 92 |
| | 180 | 637 | 0.668 | 0.331 | 0.216 | 0.721 | 0.130 | 0.084 | 0.282 | 0.271 | 102 |
| | 200 | 697 | 0.662 | 0.329 | 0.252 | 0.703 | 0.128 | 0.093 | 0.275 | 0.273 | 94 |

Figure 25:
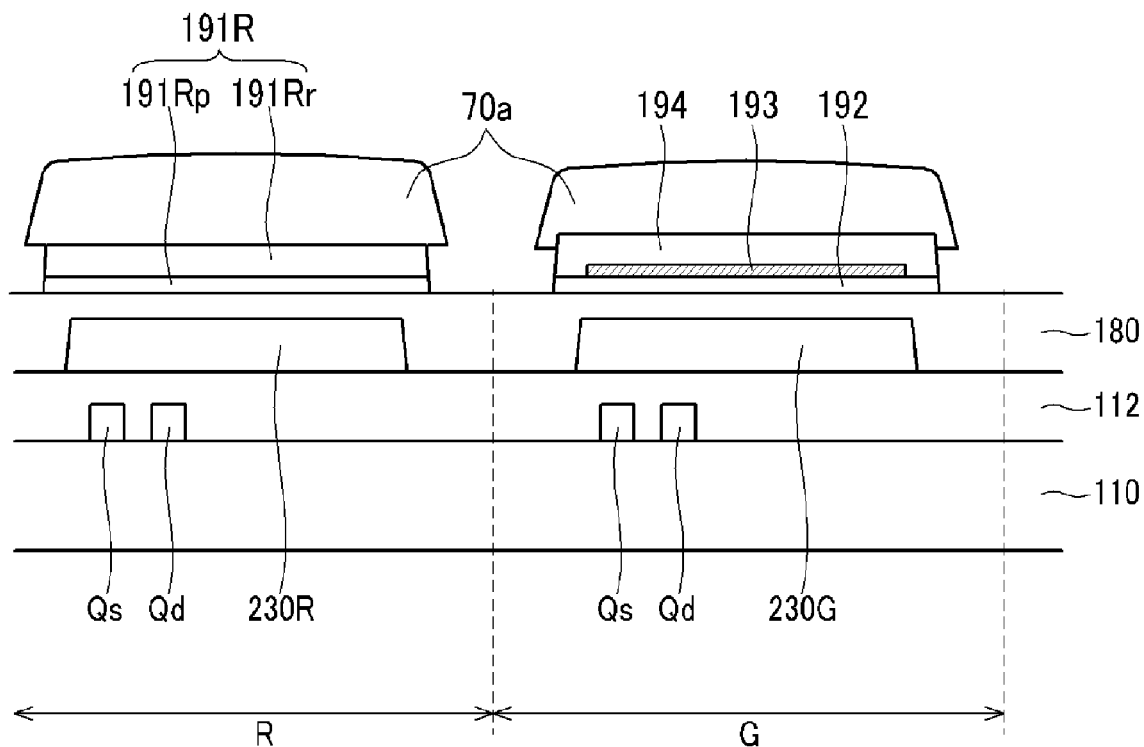

As shown in Table 1, the color reproducibility is less than 83% when the microcavity structure is not applied, and the color reproducibility is greater than 92% when the microcav- Referring to FIG. 25, the photosensitive film is formed and patterned on the upper transparent conductive layer 190*r* so that a second photosensitive film pattern 70*a* is formed. The second photosensitive film pattern 70*a* is formed on both of the red pixel R and the green pixel G.

Subsequently, a pixel electrode 191R of the red pixel R and a pixel electrode 191G of the green pixel G are formed by simultaneously etching the upper transparent conductive layer 190*r* and the lower transparent conductive layer 190*p* by using the second photosensitive film pattern 70*a* as a mask.

Figure 26:
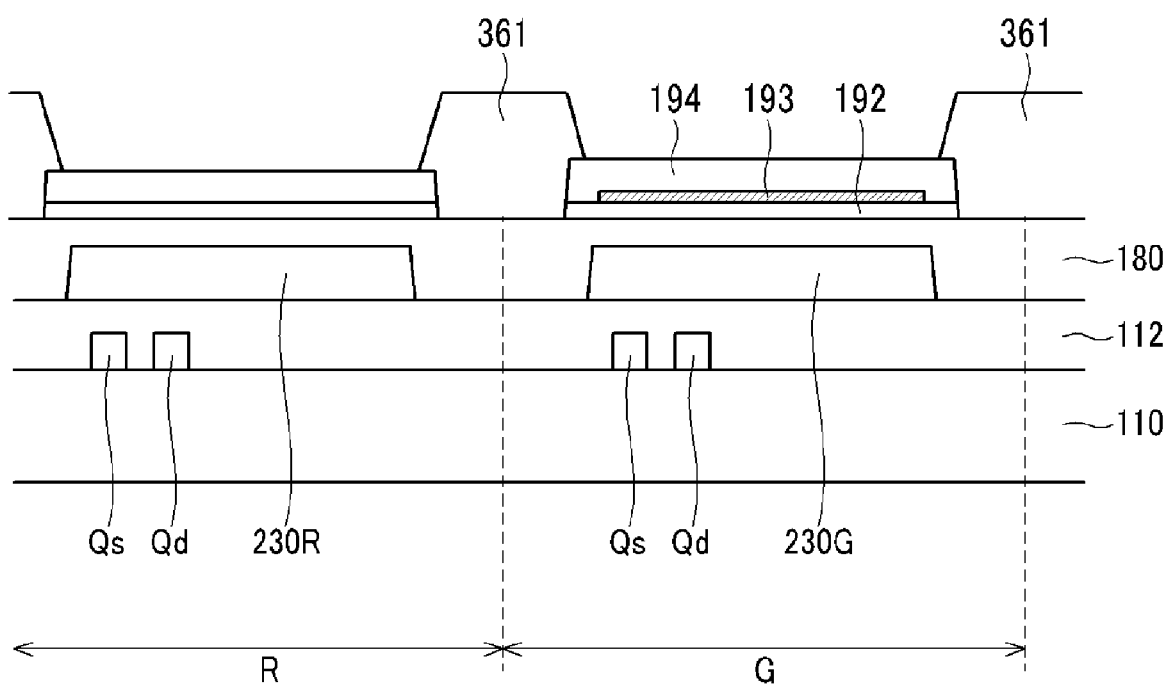

Referring to FIG. 26, a remaining second photosensitive film pattern 70*a* is removed and an insulating layer is formed and patterned on the pixel electrodes 191R and 191G and the upper insulating layer 180 so as to form a plurality of insulating members 361 which are interposed between the pixel electrodes 191R and 191G.

Referring again to FIG. 19, an emission layer 370 is formed by sequentially stacking a red emission layer (not shown), a blue emission layer (not shown), and green emission layer (not shown) on a front plane of the substrate. In this instance, the red emission layer, the blue emission layer, and the green emission layer may be stacked more than once.

Subsequently, a common electrode 270 is formed on the emission layer 370.

While the present invention has been described in connection with what is presently considered to be practical exemplary embodiments, it is to be understood that the present invention is not limited to the disclosed exemplary embodiments, but on the contrary, is intended to cover various modifications and equivalent arrangements included within the spirit and scope of the appended claims.

What is claimed is:

1. An organic light emitting diode (OLED) display comprising first to third pixels each displaying a different color, wherein each pixel comprises:
    a first electrode;
    a second electrode facing the first electrode; and
    an emission layer sandwiched between the first and second electrodes,
    wherein first electrodes of the first and second pixels comprise a transparent conductive oxide, and
    a first electrode of the third pixel comprises
    a lower first electrode that comprises a transparent conductive oxide,
    an intermediate first electrode formed on the lower first electrode and comprising a translucent conductor which forms microcavities with the second electrode, and
    an upper first electrode formed on the intermediate first electrode, comprising a transparent conductive oxide, and covering upper and lateral surfaces of the intermediate first electrode.

2. The OLED display of claim 1, wherein the upper first electrode has a thickness of 400 Å to 800 Å, and the lower first electrode has a thickness of 100 Å to 500 Å.

3. The OLED display of claim 2, wherein first electrodes of the first and second pixels comprise lower and upper layers, and the lower layer has a thickness which is substantially the same as the thickness of a lower first electrode of the third pixel and the upper layer has a thickness which is substantially the same as the thickness of an upper first electrode of the third pixel.

4. The OLED display of claim 3, wherein the intermediate first electrode has a thickness of 50 Å to 300 Å.

5. The OLED display of claim 4, wherein the lower first electrode and the upper first electrode comprise at least one selected from ITO, IZO and ZnO.

6. The OLED display of claim 5, wherein the intermediate first electrode comprises at least one selected from among silver (Ag), aluminum (Al), gold (Au), nickel (Ni), magnesium (Mg), and an alloy of at least one of the foregoing.

7. The OLED display of claim 6, wherein the first pixel is a red pixel, the second pixel is a blue pixel and the third pixel is a green pixel.

8. The OLED display of claim 7, wherein the emission layer comprises a plurality of sub-emission layers each emitting light of a different wavelength, and which emits white light by combining the lights of different wavelengths.

9. The OLED display of claim 8, wherein each of the first to third pixels further comprises a color filter formed under the first electrode.

10. The OLED display of claim 8, further comprising a white pixel, wherein the white pixel comprises:
    a first electrode,
    a second electrode facing the first electrode; and
    an emission layer sandwiched between the first and second electrodes,
    wherein the first electrode of the white pixel comprises lower and upper layers comprising a conductive oxide.

11. The OLED display of claim 2, wherein the upper first electrode has a thickness of 550 Å to 650 Å.

12. The OLED display of claim 1, wherein the first pixel is a red pixel, the second pixel is a blue pixel and the third pixel is a green pixel.

13. The OLED display of claim 12, wherein the emission layer comprises a plurality of sub-emission layers each emitting light of a different wavelength, and which emits white light by combining the light of different wavelengths.

14. The OLED display of claim 13, wherein the first to third pixels further comprise a color filter formed under the first electrode, respectively.

15. The OLED display of claim 12, further comprising a white pixel, wherein the white pixel comprises:
    a first electrode;
    a second electrode facing the first electrode; and
    an emission layer sandwiched between the first and second electrodes,
    wherein the first electrode of the white pixel comprises lower and upper layers comprising a conductive oxide.

* * * * *